(12) United States Patent
Tuckwiller et al.

(10) Patent No.: US 8,198,013 B2
(45) Date of Patent: Jun. 12, 2012

(54) METHOD FOR PREPARING A PRINTING FORM

(75) Inventors: Katherine J Tuckwiller, Newark, DE (US); Blendon G Eldridge, Marietta, GA (US)

(73) Assignee: E. I. du Pont de Nemours and Company, Wilmington, DE (US)

(*) Notice: Subject to any disclaimer, the term of this patent is extended or adjusted under 35 U.S.C. 154(b) by 3 days.

(21) Appl. No.: 12/774,195

(22) Filed: May 5, 2010

(65) Prior Publication Data

US 2011/0275017 A1  Nov. 10, 2011

(51) Int. Cl.
*G03F 1/00* (2006.01)
*G03F 7/00* (2006.01)

(52) U.S. Cl. ........................... 430/306; 430/309
(58) Field of Classification Search .............. 430/5, 300, 430/306
See application file for complete search history.

(56) References Cited

U.S. PATENT DOCUMENTS

| | | | |
|---|---|---|---|
| 4,197,126 A | 4/1980 | Wessels et al. | |
| 4,927,723 A * | 5/1990 | Cusdin ........................... 430/15 | |
| 5,292,617 A | 3/1994 | Feinberg et al. | |
| 5,460,920 A | 10/1995 | Telser et al. | |
| 5,484,684 A | 1/1996 | Telser et al. | |
| 6,217,965 B1 | 4/2001 | Gelbart | |
| 6,312,871 B1 | 11/2001 | Cusdin et al. | |
| 6,312,872 B1 | 11/2001 | Murphy et al. | |
| 6,326,124 B1 | 12/2001 | Alince | |
| 6,399,281 B1 | 6/2002 | Cusdin et al. | |
| 6,472,121 B2 | 10/2002 | Murphy et al. | |
| 6,823,793 B2 | 11/2004 | Dewitte | |
| 6,948,432 B2 | 9/2005 | Dewitte | |
| 6,954,291 B2 | 10/2005 | Klein et al. | |
| 7,033,450 B2 | 4/2006 | Salvestro | |
| 7,171,901 B2 | 2/2007 | Salvestro | |
| RE39,835 E * | 9/2007 | Kanga ........................... 430/302 |
| 2003/0075257 A1 | 4/2003 | Salvestro | |
| 2004/0060647 A1 | 4/2004 | Tabora | |

* cited by examiner

*Primary Examiner* — Cynthia Kelly
*Assistant Examiner* — Chanceity Robinson (57) ABSTRACT

The invention pertains to a method for preparing a printing form from a photosensitive element having a support and a layer of photopolymerizable material adjacent the support. The method includes exposing the photosensitive element through an image mask and through a backside mask, treating the exposed element to form a relief region and to provide an unexposed region of the photopolymerizable material remaining on the support, and removing the unexposed region from the relief region, wherein the relief region remains on the support as the printing form. The method is particularly suited for preparing a composite printing form from the printing form, and in particular for preparing composite printing forms for relief printing of corrugated substrates.

12 Claims, 3 Drawing Sheets

METHOD FOR PREPARING A PRINTING FORM

BACKGROUND OF THE INVENTION

1. Field of the Disclosure

This invention pertains to a method for the preparation of printing forms, and particularly for the preparation of composite printing forms for use in relief printing.

2. Description of Related Art

Flexographic printing plates are widely used for printing of packaging materials including corrugated carton boxes, cardboard boxes, continuous web of paper, and continuous web of plastic films. Flexographic printing plates are a form of relief printing in which ink is carried from a raised-image surface and transferred to a substrate. Flexographic printing plates can be prepared from photopolymerizable compositions that typically include an elastomeric binder, at least one monomer, and a photoinitiator, such as those described in U.S. Pat. Nos. 4,323,637 and 4,427,759. The photosensitive elements generally have a solid layer of the photopolymerizable composition interposed between a support and a coversheet or a multilayer cover element.

Corrugated boxes and other relatively large objects that are printed using relief image printing plates often bear actual printing on only a small portion of their total surface area. That is, only relatively small areas of the corrugated substrate need to be printed compared to the overall size of the component being formed from the corrugated substrate. Since only portion of the surface of the substrate needs to be printed only small portion/s of the single plate will actually be used for ink transfer to create the printed image/s, and large portions of the printing plate will not be used, i.e., have no image. Those skilled in the art often print relatively large objects and corrugated board substrates with composite printing plates or composite printing forms. Composite printing forms are prepared by creating one or more relatively small (compared to the overall size of the substrate being printed) relief image printing plates or printing portions, on a carrier at location/s that correspond to image/s that is to be printed on the corrugated substrate.

One method to prepare a composite printing form, which sometimes referred to as in-position workflow, utilizes a single printing plate to create the relatively small relief image portions that remain intact on the support of the plate. In some instances of in-position workflow, the large unimaged portions, i.e., unused portions, of the single printing plate are removed by cutting through the photopolymerizable layer surrounding the printing portion/s, and stripping the unused portions of the layer from the support prior to washout. Examples of in-position workflow are disclosed in U.S. Pat. Nos. 5,292,617; 5,460,920; and 5,484,684. However, stripping or removal of the unused portions of the photopolymerizable layer from the support can sometimes be difficult or cumbersome and may disrupt the small portions remaining on the support. In particular, manual stripping of the unused portions of a very thick photopolymerizable layer, that is a photopolymerizable layer having a thickness of about 150 to 270 mils (0.381 to 0.686 cm), from the support can be cumbersome and problematic.

In other instances of in-position workflow, the unused portion/s, i.e., unimaged portions, of the single relief printing plate are removed by washout processing at the same time as the portion/s of the relief image is being formed. One example of in-position workflow with washout is disclosed in U.S. Pat. No. 4,927,723. However, removal of the unused portion places extreme stress on the washout apparatus and on the relief image plate. Excessively long washout time is needed to try to remove the unused portions of the plate, which can cause increased swelling of the plate and/or increased throughput of solvent and output of volatile organic components. It is often very difficult to washout the unused portions of the photopolymerizable layer completely down to the substrate without damaging the raised relief portions of the one or more printing areas. Oftentimes some small section/s or a relatively thin layer of the unused portion/s remains on the substrate after washout, which because of its size and the characteristics of the material, is too difficult to completely strip or remove from the substrate. The composite printing form composed of the relief image portions remaining on the support may be mounted directly on the printing cylinder, or more typically may be mounted onto a carrier sheet which is then mounted on the printing cylinder.

Another way to print corrugated board substrates and other large objects is to prepare a composite printing form having one or more relatively small image portions, or printing areas, individually mounted onto a carrier at locations that correspond to the print image areas on the substrate. The relief image on the relatively small image portions, sometimes referred to as slugs, may be prepared individually or, collectively from a relief printing plate and then separated into the individual portions. Selective mounting of the small relief image portions on the carrier requires careful adhesion of the individual portions to the carrier while assuring accurate registration, in order to print high quality images and multi-color reproduction.

Other methods of preparing composite printing plates have been suggested, such as in U.S. Pat. No. 5,846,691; U.S. Pat. No. 6,312,871; U.S. Pat. No. 6,312,872; U.S. Pat. No. 6,399,281; and U.S. Pat. No. 6,472,121, which do not require precise registration of constituent photocurable elements. Generally the methods involve disposing at least one photocurable element upon a surface of a carrier in approximate register and then transferring a computer generated negative to a surface of the elements. The methods include transferring registration information of any visually perceptible modification of the printing element, i.e., carrier, that is intended to reflect positioning of the photocurable elements. The negative or mask may be generated by jetting ink onto the surface of the element or by exposing with laser radiation to selectively remove a radiation opaque layer from the surface of the element.

In those instances in which the relatively small image portions or slugs are selectively mounted on the carrier at locations that correspond to the print image areas, oftentimes a problem occurs during printing in that one or more of the slugs lift or loosen from the carrier. Printing inks generally include one or more solvents that can attack an adhesive or tape used to mount the slugs onto the carrier. The ink solvent/s changes the adhesion of the slug along its perimeter, weakening the attachment of the slug to the carrier causing the slug to slip, shift, or completely lift off of the carrier.

There remains a need in the art for an alternative process for preparing a composite printing form from constituent image portions that avoids the problems and/or overcomes the difficulties of prior methods for preparing composite printing forms. In particular, there remains a need for an alternative, easy to use, process for preparing the composite printing form that includes relatively small image portions which are constituent relief image printing plates for the composite printing form.

SUMMARY

In accordance with this invention there is provided a method for preparing a printing form from a photosensitive element comprising a photopolymerizable layer on a support that includes a) providing a front mask adjacent the photosensitive element disposed above a side of the photopolymerizable layer opposite the support, wherein the front mask comprises an image region and a non-image region; b) forming from an actinic radiation opaque sheet a backside mask having an intact region and a cutout region; c) placing the backside mask adjacent to the support of the element of step a), and aligning the intact region with the non-image region; d) exposing the element of step c) to actinic radiation through the front mask forming cured portions of the photopolymerizable layer corresponding to the image region; e) exposing the element of step c) to actinic radiation through the backside mask forming a cured floor adjacent the cured portions, and providing an unexposed region of the photopolymerizable layer corresponding to the non-image region; f) treating the element resulting after the exposing steps d) and e) to form a relief region of the cured portions with the floor, wherein at least some of the photopolymerizable layer remains on the support at the unexposed region; and g) removing the unexposed region of the photopolymerizable layer from the support and from the relief region wherein the relief region remains on the support forming the printing form.

DESCRIPTION OF THE PREFERRED EMBODIMENTS

The present invention is a method for preparing a printing form from a precursor capable of forming a relief printing image. The precursor is a photosensitive element, and in particular can be a photopolymerizable element. The method is suited for preparing a composite printing form that incorporates the prepared printing form or forms. The method is particularly suited for preparing a composite printing form for relief printing of corrugated substrates.

In some end-use applications of corrugated board printing, a relatively small portion of the corrugated substrate is printed compared to the overall size of the component being formed from the corrugated substrate. However, in corrugated board printing, the printing cylinder is not typically removable from the printing press which makes it difficult to register the image of the printing plate to the printing cylinder. As such, a print plate is not mounted directly to the corrugated board printing cylinder, and instead is mounted to a carrier which provides the capability to register the image on the printing plate to the corrugated board printing cylinder and the corrugated board substrate. In one embodiment, a composite print form is prepared by mounting one or more of the prepared printing forms onto a carrier. In another embodiment, a composite print form is prepared from the prepared printing form wherein the support of the printing form acts as the carrier for the composite print form.

Figure 1:
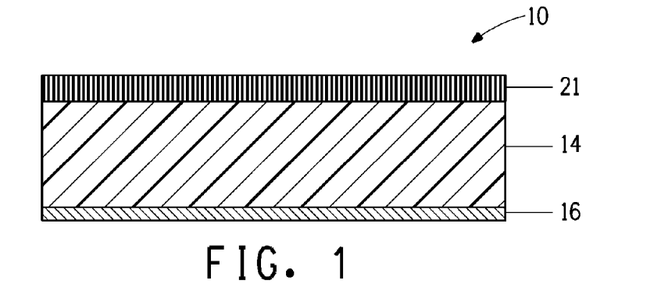
FIG. 1 is a schematic representation of one embodiment of a cross-section of a photosensitive element for use in the present method, the photosensitive element having an actinic radiation opaque layer disposed above a photopolymerizable layer on a support
Figure 2:
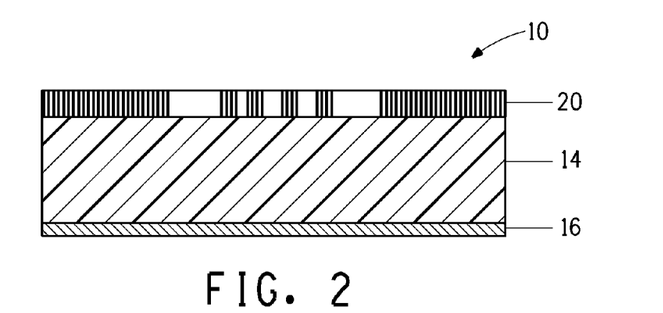
FIG. 2 is a sectional view of the photosensitive element showing a step of the present method that includes one embodiment for providing a mask disposed above a side of the photopolymerizable layer opposite the support, wherein the mask includes an image region and a non-image region.

In one embodiment, as shown in FIG. 1 and FIG. 2, the precursor 10 that is used for preparing the print form for relief printing is a photosensitive element 10 that includes at least one photopolymerizable layer 14. In most embodiments, the photosensitive element 10 that is used for preparing one or more print forms for use in a composite printing form for relief printing includes a support 16 and the at least one photopolymerizable layer 14 adjacent the support. The photopolymerizable layer is an elastomeric layer that includes a binder, at least one monomer, and a photoinitiator.

The present method includes providing a mask 20 adjacent the photosensitive element 10 disposed above a side of the photopolymerizable layer 14 opposite the support 16. The mask 20, which may also be referred to as a front mask, or a front-side mask, or an image mask, is not particularly limited and can include an image-bearing artwork or a template, such as a photographic negative or phototool (e.g. silver halide film) or an integrated mask having image regions that previously had been formed above the photopolymerizable layer. Preparation of a phototool is well known to those of ordinary skill in the art. As shown in FIG. 1 and FIG. 2, in most embodiments, the photosensitive element 10 includes an actinic radiation opaque layer 21 disposed above the photopolymerizable layer 14 (opposite the support 16). The actinic radiation opaque layer 21 is capable of forming the mask 20 based upon digital information, which may be referred to as an integrated mask or an in-situ mask. In some embodiments, the actinic radiation opaque layer 21 may also be sensitive to infrared radiation for digital mask formation by infrared laser radiation, and thus the actinic radiation opaque may also be referred to as an infrared sensitive layer 21. Alternate embodiments of the photosensitive element 10 with a radiation opaque layer and/or an infrared sensitive layer are also possible. The actinic radiation opaque layer can be integral with the photosensitive element or can be associated with a separate element which combines to form an assemblage. The uncured photosensitive element having the actinic radiation opaque layer (or the integral mask) may sometimes be referred to herein as a digital photosensitive element.

Figure 4:
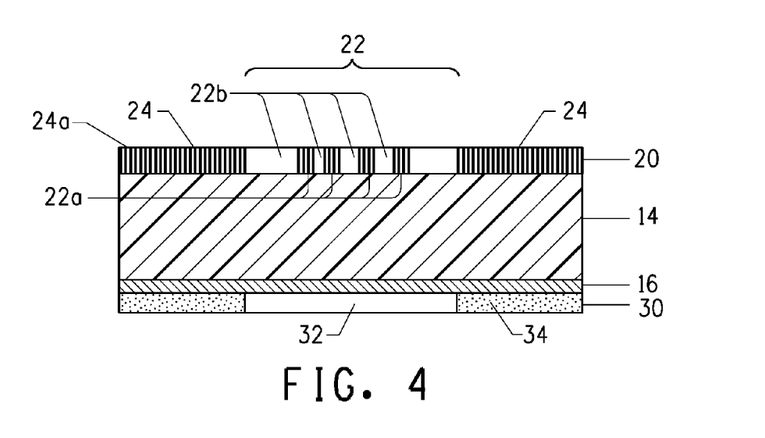
FIG. 4 is a sectional view of the photosensitive element and the backside mask, showing a step of assembling the photosensitive element and the backside mask by locating the backside mask adjacent to the support of the photosensitive element and aligning of the backside mask with the mask of the photosensitive element.

As shown in FIG. 4, the front mask 20 includes at least an image region 22 and a non-image region 24. In order to make the most efficient use of the photosensitive element 10 and minimize handling of the element, more than one image regions 22 (each of which will ultimately become a printing form for one or more composite forms) will be laid out adjacent to one another to form the mask 20 for the precursor. In most embodiments, the mask 20 will include more than one image region 22 and more than one non-image region 24. In most embodiments, a non-image region 24 will surround each image region 22, to provide a margin of open space around the image region and separate one image region from adjacent image regions. The mask includes opaque areas and "clear" areas. The opaque areas of the mask prevent the photopolymerizable material beneath from being exposed to the actinic radiation and hence those areas of the photopolymerizable layer covered by the dark areas do not polymerize. The "clear" areas of the mask expose the photopolymerizable layer to actinic radiation and polymerize or crosslink. The image region 22 of the mask 20 includes the opaque area/s 22a and the clear area/s 22b, which together will provide an image suitable to form a relief structure for printing by the printing form. The non-image region 24 of the mask 20 includes an opaque area/s 24a.

As is well known to those skilled in the art, the design of graphic information, including text and images, that is to be printed by the composite printing form is captured and manipulated in computer software to create data files including page layout data. The page layout data can be based upon vector or bitmapped data representing one or more of the locations that graphic information will be printed on the "page" or substrate. The page layout data can be used to generate the image region/s separated by non-image region/s, and be used by the imaging device, i.e., laser imager, that forms the mask for the photosensitive element. The page layout data can be used to determine the number and sizes of the printing forms that are needed for one or more composite printing forms. Based on the page layout data, a computer typically also generates a cutting guide for the precursor.

Digital methods relate to any method of digitally (i.e., computer-controlled) transferring of graphic information, including text and images, generated from a computer (data file(s)) to the precursor. In some embodiments, digital methods involve the formation of an image disposed above the photosensitive layer and integrated with the photosensitive element so as to serve as an integrated mask having the image region of opaque areas and clear areas. Digital methods may also be referred to as computer-to-plate technology or methods. Digital methods may also be referred to herein as digital technology, or digital image technology.

In one embodiment in which the precursor 10 includes the infrared sensitive layer 21 disposed above the photopolymerizable layer 14 as shown in FIG. 1, the integrated mask 20 is formed digitally from the infrared sensitive layer. In preparation for exposing the precursor to actinic radiation through a mask, the integrated mask is first formed on or disposed above the surface of the photopolymerizable layer opposite the support. The infrared sensitive layer can itself form the integrated mask for the photosensitive element or can be used in conjunction with one or more adjacent (radiation opaque) layers to form the integrated mask on the element. The image necessary for the imagewise exposure of the photopolymerizable layer can be generated by any digital method.

The digital photosensitive element includes an infrared sensitive layer, which in some embodiments can also function as an actinic radiation opaque layer, that is used in digital image technology in which laser radiation is used to form the integrated mask for the photosensitive element (instead of the conventional phototool film image). Digital methods create the integrated mask on or disposed above the photopolymerizable layer with laser radiation. Digital methods of creating the mask image require one or more steps to prepare the photosensitive element prior to imagewise exposure. Generally, digital methods of in situ mask formation either selectively remove or transfer the radiation opaque layer, from or to a surface of the photosensitive element opposite the support. The presence of materials in the infrared sensitive layer that are black, such as dark inorganic pigments, such as carbon black and graphite, mixtures of pigments, metals, and metal alloys function as both infrared-sensitive material and radiation-opaque material. The integral mask remains on the photosensitive element for subsequent step of exposure to actinic radiation.

In one digital method, the photosensitive element will initially include the infrared sensitive layer that covers or substantially covers the entire surface of the photopolymerizable layer. The infrared sensitive layer is exposed imagewise to infrared laser radiation to form the image on or disposed above the photopolymerizable layer, i.e., the integral mask. The infrared laser radiation can selectively remove, e.g., ablate or vaporize, the infrared sensitive layer (i.e., radiation opaque layer) from the photopolymerizable layer, as disclosed by Fan in U.S. Pat. Nos. 5,262,275 and 5,719,009; and Fan in EP 0 741 330 B1. A material capture sheet adjacent the infrared sensitive layer may be present during laser exposure to capture the material as it is removed from the photosensitive element as disclosed by Van Zoeren in U.S. Pat. No. 5,506,086. Only the portions of the infrared sensitive layer that were not removed from the photosensitive element will remain on the element forming the integral mask of radiation opaque material.

In another digital method of mask formation, the photosensitive element will not initially include the infrared sensitive layer. A separate element bearing the infrared sensitive layer as a radiation opaque layer will form an assemblage with the photosensitive element such that the radiation opaque layer is adjacent the surface of the photosensitive element opposite the support, which is typically the photopolymerizable layer. (If present, a coversheet associated with the photopolymerizable layer may be removed prior to forming the assemblage). The separate element may include one or more other layers, such as ejection layers or heating layers, to aid in the digital exposure process. These other layers may also be considered an infrared sensitive layer. Hereto, the radiation opaque layer is also sensitive to infrared radiation. The assemblage is exposed imagewise with infrared laser radiation to selectively transfer the radiation opaque layer and form the image on or disposed above the photopolymerizable layer as disclosed by Fan et al. in U.S. Pat. No. 5,607,814; and Blanchett in U.S. Pat. Nos. 5,766,819; 5,840,463; and EP 0 891 877 A. Only the portions of the radiation opaque layer which were transferred will reside on the photosensitive element forming the integral mask.

It is also contemplated that the integral mask may be created on a separate carrier and then transferred by application of heat and/or pressure to the surface of the photopolymerizable layer opposite the support. The photopolymerizable layer is typically tacky and will retain the transferred image. Optionally, the separate carrier can then be removed from the element prior to imagewise exposure. The separate carrier may have an infrared sensitive layer which is also a radiation opaque layer or associated with a radiation opaque layer, that is imagewise exposed to infrared laser radiation to selectively remove the radiation opaque material and form the image. An example of this type of separate carrier is LaserMask® imaging film by Rexam, Inc. Alternatively, the image of radiation opaque material may be transferred to the separate carrier from another element having the radiation opaque material by laser radiation.

The imagewise exposure with infrared laser radiation can be carried out using various types of infrared lasers, which emit in the range 750 to 20,000 nm. Infrared lasers including diode lasers emitting in the range 780 to 2,000 nm and Nd:YAG lasers emitting at 1064 nm are preferred. A preferred apparatus and method for infrared laser exposure to imagewise remove the actinic radiation opaque layer from the photosensitive element is disclosed by Fan et al. in U.S. Pat. Nos. 5,760,880 and 5,654,125. The integrated mask remains on the photosensitive element for subsequent step of overall exposure to actinic radiation. One suitable infrared laser exposure apparatus used for digital formation of an in-situ mask on a surface of the photosensitive element is a CYREL® Digital Imager (sold by EskoArtwork, from Gent, Belgium).

Figure 3:
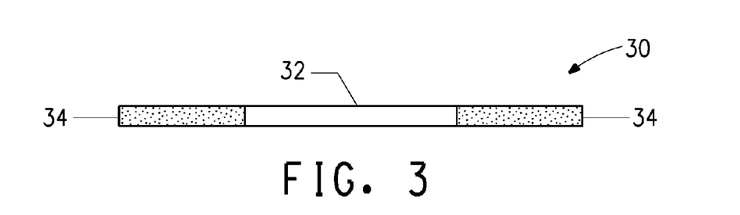
FIG. 3 is a sectional view of one embodiment of an actinic radiation opaque sheet showing a step of forming a backside mask having intact region and cutout region.

The present method includes forming a backside mask 30 from an actinic radiation opaque sheet. As shown in FIG. 3, the backside mask 30 includes a cutout region 32 and an intact region 34. In most embodiments, the backside mask 30 will include more than one cutout region 32 and more than one intact region 34. The actinic radiation opaque sheet is not particularly limited, provided that the material selected as the sheet can sufficiently prevent the actinic radiation from transmitting through the sheet (at the intact region's), and can be cut to create the one or more cutout regions. The actinic radiation opaque sheet can sufficiently prevent the actinic radiation from transmitting through (the intact region/s) to the photosensitive element when the actinic radiation opaque sheet has a transmittance of less than or equal to 2.3%. In some instances this transmittance corresponds to the actinic radiation opaque sheet having an optical density of greater than about 1.6. In one embodiment, the transmittance of the actinic radiation opaque sheet is less than or equal to 1.6%. Materials suitable to form the backside mask include, but are not limited to golden rod, and orange plastic sheeting. The one or more cutout regions 32 of the backside mask 30 can be cut manually or by a computer-driven cutting device. In most embodiments, the material forming the backside mask is placed on an automatic cutting table that is connected to the computer and the cutout region/s are cut into the suitable size and shape based on the page layout data. The size and shape of each of the one or more cutout regions 32 of the backside mask 30 are the same as or substantially the same as the size and shape of each of the one or more corresponding image regions 22 of the mask 20 disposed above the photopolymerizable layer, i.e., front-side mask 20. A particularly suitable cutting table is a Kongsberg digital converting table, manufactured by EskoArtwork. Typically, once the one or more cutout regions of the backside mask are removed, the one or more intact regions are still connected such that the backside mask remains a unitary sheet.

As shown in FIG. 4, the present method includes assembling the photosensitive element 10 with the image mask 20 and the backside mask 30. The assembling step includes placing the backside mask 30 adjacent the support 16 of the photosensitive element 10, and aligning the backside mask 30 with the mask 20 associated with the photosensitive element. In one embodiment, the assembling step includes placing the photosensitive element 10 having the integrated mask 20 adjacent the backside mask 30, and aligning the intact region/s 34 of the backside mask 30 with the non-image region/s 24 of the integrated mask 20. In another embodiment, the assembling includes placing the phototool adjacent the side of the photosensitive element opposite the support, placing the backside mask adjacent the support side of the photosensitive element, and aligning the intact region/s of the backside mask with the non-image region/s of the phototool with the photosensitive element between the front-side mask and the backside mask. Aligning the intact region/s 34 of the backside mask 30 with the corresponding non-image regions 24 of the front-side mask 20 also concurrently aligns the cutout region/s 32 of the backside mask 30 with the image region/s 22 of the front-side mask 20. In some embodiments because the photosensitive element and the backside mask can have substantially the same size, i.e., having the same or substantially the same length and width dimensions, the intact region/s of the backside mask and the non-image region/s of the front-side mask will align appropriately by merely positioning the appropriate dimensions of the photosensitive element adjacent the corresponding dimensions of the backside mask. In other embodiments, the backside mask and the photosensitive element (and the phototool) can each be punched with one or more holes along one edge, and mounted on a pin bar to assure appropriate alignment of the backside mask with the front-side mask of the photosensitive element. In yet other embodiments, the backside mask and the integrated mask can each include one or more registration markings, such as targets or crossed-lines for example, at appropriate locations determined by the page layout data, and the registration markings are used to align the intact region/s of the backside mask and the non-image region/s of the front-side mask. Registration markings can include any kind of visual indicator's that can be made on the masks that can be aligned.

The backside mask 30 and photosensitive element 10 having the front-side mask 20 are assembled on a device for exposing the photosensitive element to actinic radiation, in preparation for the next steps of exposing the photosensitive element to actinic radiation. Although the present invention is not so limited, in most embodiments, the exposure device is a flat-bed exposure device in which the assembled photosensitive element and backside mask reside on a flat horizontal transparent surface, adjacent one or more sources of actinic radiation.

Figure 5A:
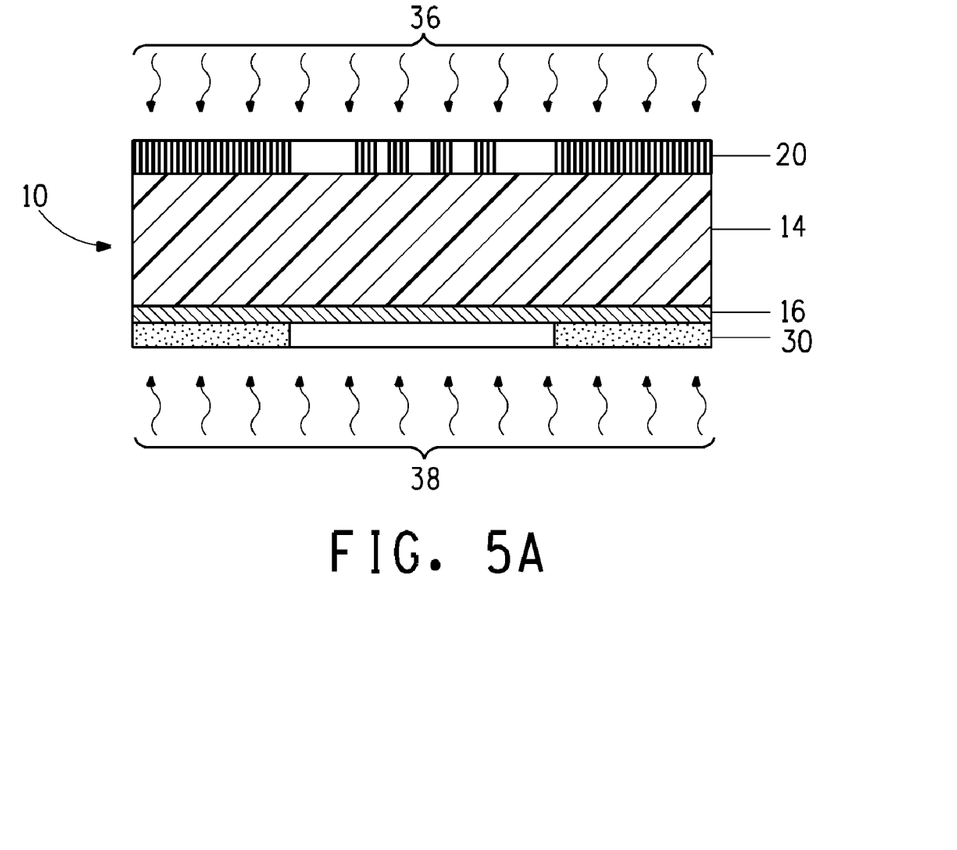
FIG. 5a is a sectional view of the photosensitive element and the backside mask, showing a step of exposing the photosensitive element to actinic radiation through the mask, and a step of exposing the photosensitive element to actinic radiation through the backside mask.

As shown in FIG. 5a, the method of the present invention includes the steps of exposing the photosensitive element 10 to actinic radiation 36 through the front-side mask 20; and, exposing the photosensitive element to actinic radiation 38 through the backside mask 30. Exposing the photosensitive element 10 to actinic radiation through the front-side mask 20 and the backside mask 30 selectively exposes the photopolymerizable layer from the front-side and the backside. The exposing of the photosensitive element 10 to actinic radiation 36 through the front-side 20 mask can be done sequentially in any order, or, can be done simultaneously with the exposing of the photosensitive element to actinic radiation 38 through the backside mask 30. The opaque areas of the masks prevent the photopolymerizable material beneath from being exposed to the actinic radiation and hence those areas of the photopolymerizable layer covered by the dark or opaque areas do not polymerize. The "clear" areas of the mask allow the actinic radiation to expose the photopolymerizable layer and polymerize or crosslink or cure.

Figure 5B:
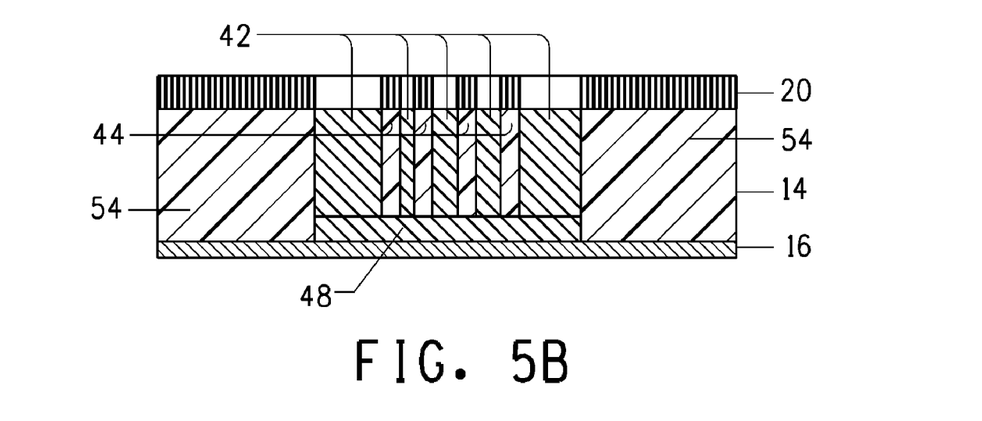
FIG. 5b is a sectional view of the photosensitive element after exposing steps showing cured portions in the photopolymerizable layer corresponding to the image region; a cured floor adjacent the cured portions; and providing an unexposed portion of the photopolymerizable layer corresponding to the non-image region.

As shown in FIG. 4, FIG. 5a, and FIG. 5b, the image region 22 of the front-side mask 20 includes opaque areas 22a and clear areas 22b, which after exposing through the front-side mask, will form cured portions 42 and unexposed portions 44 in the photopolymerizable layer 14 corresponding to the image region 22. After treating to remove the unexposed portions 44 of the photopolymerizable layer corresponding to the image region 22, the cured portions 42 remain to form a relief region 50 which is a relief surface suitable for printing by the printing form. The non-image region 24 of the front-side mask 20 includes only opaque areas 24a, which after exposure through the front-side mask, will not cure or polymerize the underlying photopolymerizable layer 14. After exposure, the photopolymerizable layer corresponding to the non-image region 24 of the front-side mask 20 is an unexposed region 54 of the layer 14.

The cutout region 32 of the backside mask 30 is essentially a clear area, which exposure of the photosensitive element to actinic radiation through the cutout region of the backside mask cures the photopolymerizable layer. Exposure to actinic radiation 38 through the backside mask 20 is sufficient to form a floor 48 of cured photopolymer adjacent the cured portions 42 in the relief region 50. The intact region 34 of the backside mask 30 has sufficiently low transmittance that it is essentially an opaque area that prevents polymerization or curing of the photopolymerizable layer 14 adjacent to the intact region, such that the unexposed region 54 of the photopolymerizable layer 14 corresponding to the non-image region 24 remains uncured or not crosslinked. After the front-side and backside exposures to actinic radiation, the photopolymerizable layer 14 adjacent the non-image region 24 of the front-side mask 20 and adjacent the intact region 24 of the backside mask 30, is the unexposed region 54 of the photosensitive element. After the front-side and backside exposures to actinic radiation, the photopolymerizable layer adjacent the image region 22 of the front-side mask 20 and adjacent the cutout region 32 of the backside mask 30, is a image portion of the photopolymerizable layer 14 having both the cured portions 42 and the uncured portions 44 adjacent the floor 48 of cured polymeric material.

The photosensitive element 10 is exposed through the image region/s 22 of the front-side mask 20 and the cutout region/s 32 of the backside mask 30 to actinic radiation from suitable sources. The actinic radiation exposure time can vary from a few seconds to minutes, depending upon the intensity and spectral energy distribution of the radiation, its distance from the photosensitive element, the desired image resolution, and the nature and amount of the photopolymerizable composition. Exposure temperatures are preferably ambient or slightly higher, i.e., about 20° to about 35° C. Exposure through the image regions of the front-side mask is of sufficient duration to crosslink the exposed areas down to the back exposed layer, i.e., floor. Imagewise exposure time, i.e., exposure through the image region/s of the front-side mask, is typically much longer than back exposure time, i.e., exposure through the cutout region/s of the backside mask, and ranges from a few to tens of minutes.

Actinic radiation sources encompass the ultraviolet and visible wavelength regions. The suitability of a particular actinic radiation source is governed by the photosensitivity of the initiator and the at least one monomer used in preparing the photosensitive element. The preferred photosensitivity of most common photosensitive elements for relief printing are in the UV and deep UV area of the spectrum, as they afford better room-light stability. Examples of suitable visible and UV sources include carbon arcs, mercury-vapor arcs, fluorescent lamps, electron flash units, electron beam units, lasers, and photographic flood lamps. The most suitable sources of UV radiation are the mercury vapor lamps, particularly the sun lamps. Examples of industry standard radiation sources include the Sylvania 350 Blacklight fluorescent lamp (FR48T12/350 VL/VHO/180, 115w), and the Philips UV-A "TL"-series low-pressure mercury-vapor fluorescent lamps. Typically, a mercury vapor arc or a sunlamp can be used at a distance of about 1.5 to about 60 inches (about 3.8 to about 153 cm) from the photosensitive element. These radiation sources generally emit long-wave UV radiation between 310-400 nm. Flexographic printing plates sensitive to these particular UV sources use photoinitiators that absorb between 310-400 nm.

Imagewise exposure under vacuum is typically used when the mask is a phototool. Imagewise exposure of the photosensitive element having the integral mask to actinic radiation is not limited, and may be conducted in the presence of atmospheric oxygen, or in the absence of atmospheric oxygen, or in an environment having an inert gas and a concentration of oxygen less than atmospheric. Atmospheric oxygen is eliminated when the exposure is conducted in a vacuum. The exposure may be conducted in a vacuum to minimize the effects of oxygen on the polymerization reactions occurring in that layer. The exposure may be conducted in the presence of atmospheric oxygen since the mask is formed in situ or applied imagewise with radiation opaque material on the photopolymerizable layer, there is no need for vacuum to assure intimate contact of the integral mask. In some embodiments of the method of preparing the printing form, the exposure step is conducted without vacuum, i.e., while the photosensitive element is in the presence of atmospheric oxygen, and without any additional layers present on top of the integral mask. In other embodiments of the method of preparing the printing form, the exposure step is conducted in an environment having an inert gas and a concentration of oxygen between 190,000 parts per million (ppm) and 100 ppm. Suitable inert gases include, but are not limited to, argon, helium, neon, krypton, xenon, nitrogen, carbon dioxide, and combinations thereof. Suitable methods of exposing the digital photosensitive element in an environment having an inert gas and a controlled oxygen concentration in a range between 190,000 parts per million (ppm) and 100 ppm is described in U.S. Publ. No. 2009/0186308; U.S. Publ. No. 2009/0191482; and U.S. Publ. No. 2009/0191483.

The step of exposing the photosensitive element 10 to actinic radiation 38 through the backside mask 30 exposes the photopolymerizable layer 14 through the cutout region 32 of the backside mask and forms the floor 48 of cured polymeric material adjacent the cured portions 42 corresponding to the image region 22. Backside exposure is used to create the layer of polymerized material, i.e., the floor, on the support 16 side of the photopolymerizable layer 14 and can sensitize the photopolymerizable layer. The floor 48 provides improved adhesion between the photopolymerizable layer and the support and establishes the depth of the relief. The backside mask 30 is used to selectively expose one or more portions of the photopolymerizable layer 14 adjacent to the support 16, which portions correspond to the cutout regions 32 of the backside mask 30. The presence of the intact regions 34 of the backside mask 30 during back exposure to actinic radiation prevents the photopolymerizable material adjacent to the intact regions from being exposed, and hence, area/s of the photopolymerizable layer covered by the intact region/s do not form a floor or polymerize or cure. Exposure through the backside mask 30 that has the intact region/s 34 provides the photosensitive element with the unexposed region 54 of the photopolymerizable layer 14 corresponding to the non-image region 24 of the front-side mask 20. The backflash exposure 38 can take place before, after or during the other imaging steps. Any of the conventional radiation sources discussed above for the overall (imagewise) actinic radiation exposure step can be used for the backflash exposure step. Exposure time generally range from a few seconds up to a few minutes. In most embodiments, the floor has a thickness of about one half of the total thickness of the photopolymerizable layer, but is not so limited.

The present method is different than conventional methods of preparing a relief printing form from a photosensitive element having a solid photopolymerizable layer in that conventional methods include a non-selective backflash exposure, i.e., overall or blanket exposure without a mask, to actinic radiation to form a cured layer of photopolymer, i.e., floor, adjacent the support in the image regions and in the non-image regions. The present method includes the presence of the backside mask which allows for selective backflash exposure of the photopolymerizable layer through the support, and selective formation of the floor of polymeric material for the photosensitive element. Because backside exposure can provide improved adhesion between the photopolymerizable layer and the support, and the backside mask selectively exposes the photopolymerizable layer on the support, the adhesion of the photopolymerizable layer to the support can be different between the relief region 50 and the unexposed region 54, such that removal of the unexposed region 54 in a subsequent step is facilitated.

Figure 6:
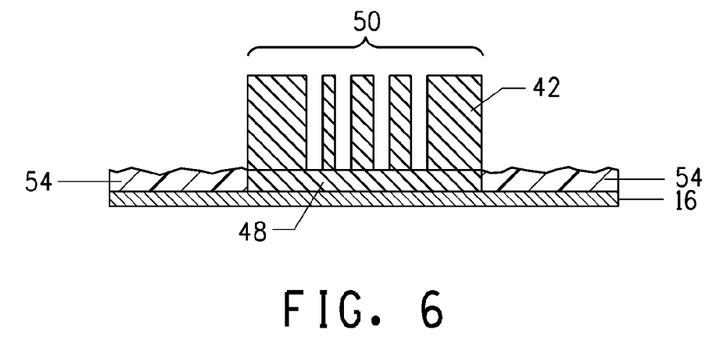
FIG. 6 is a sectional view of the photosensitive element of FIG. 5b showing the photosensitive element after a step of treating to form a relief region of the cured portions by removing the unexposed portions of the photopolymerizable layer corresponding to the image region, wherein at least some of the unexposed portion of the photopolymerizable layer remains in a portion corresponding to the non-image region.

Following exposure to UV radiation through both the front-side mask 20 and the backside mask 30, the present method includes treating the photosensitive element 10 to form a relief surface suitable for printing in one or more areas of the element that correspond to the one or more image regions 22 of the front-side mask 20. As shown in FIG. 6, the treating step removes some or all of the photopolymerizable material in the areas which were not exposed to actinic radiation, i.e., the unexposed areas or uncured areas, of the photopolymerizable layer. Treating the element after the front-side and backside exposures removes uncured, i.e., unexposed portions 44 in the corresponding image regions 22 of the photopolymerizable layer 14. Treating removes the unexposed portions 44 of the photopolymerizable layer 14 corresponding to the image region 22 and thereby forms the relief region 50 of the cured portions 42 with the floor 48 that corresponds to the image region 22. Treating can also remove some of the photopolymerizable layer 14 at the unexposed portions 54 that correspond to the intact region 34 of the backside mask 30 and the non-image region 24 of the front-side mask 20. The present method avoids the need for the treating step to completely remove the layer of photopolymerizable material 14 all the way to the support 16 in the non-image region/s 24 of the photosensitive element 10, and thereby minimizes the impact on the treating apparatus and the process, as well as minimizes or eliminates damage to the relief area/s of the printing form. In most embodiments, treating will remove unpolymerized portions 44 in photopolymerizable layer 14 corresponding to the image region/s 22 of the front-side mask, and thereby form the relief region 50, and, will remove some of the unexposed photopolymerizable material corresponding to the non-image region 24 of the front-side mask to create the unexposed region 54. Except for an elastomeric capping layer, typically the additional layers that may be present on or above the photopolymerizable layer are removed or substantially removed from the polymerized areas of the photopolymerizable layer. For photosensitive elements having the integrated mask image, the treating step also removes the mask image (which had been exposed to actinic radiation).

In most embodiments, the floor 48 has a thickness of about one half of the total thickness of the photopolymerizable layer 14. In some embodiments after treating, the unexposed region 54 of the photopolymerizable layer 14 remaining on the support 16 that correspond to the non-image region 24 has a thickness that is the same or substantially the same as the thickness of the floor 48 created in the image region 22. In other embodiments after treating, the unexposed region 54 of the photopolymerizable layer 14 remaining on the support 16 that corresponds to the non-image region 24 has a thickness that is less than the thickness of the floor 48 in the relief region 50. After treating, the non-image region 24 has a thickness that can be from about 40 mils (0.10 cm) to about the thickness of the floor 48. In other embodiments after treating, the non-image region 24 has a thickness that can be from about 50 mils (0.13 cm) to about the thickness of the floor 48. In yet other embodiments after treating, the non-image region 24 has a thickness that can be in a range from about the thickness of the floor to about 20 mils (0.051 cm) less than the floor thickness. That is, the thickness of the non-image region 24 can be from about 1 to about 20 mils (0.0025 cm to 0.051 cm) less than the floor thickness. In still other embodiments after treating, the non-image region 24 has a thickness that can be in a range from about the thickness of the floor to about 10 mils (0.03 cm) less than the floor thickness. That is, the thickness of the non-image region 24 can be from about 1 to about 10 mils (0.0025 cm to 0.025 cm) less than the floor thickness. This method is particularly suitable for photosensitive elements with a photopolymerizable layer having a thickness of about 90 to 280 mils (0.23 to 0.71 cm). For example, after treating a photosensitive element having photopolymerizable layer with a thickness of about 102 mils (0.26 cm), the floor can have a thickness of about 51 mils (0.129 cm), and the remaining unexposed region of the photopolymerizable layer corresponding to the non-image region has a thickness that can be about 30 to about 51 mils (0.08 to 0.129 cm). As another example, after treating a photosensitive element having photopolymerizable layer with a thickness of 245 mils (0.62 cm), the floor can have a thickness of about 123 mils (0.31 cm), and the remaining unexposed region of the photopolymerizable layer corresponding to the non-image region has a thickness that can be about 50 to about 123 mils (0.13 to 0.31 cm).

Treatment of the photosensitive printing element includes (1) "wet" development wherein the photopolymerizable layer is contacted with a suitable developer solution to washout unpolymerized areas in the image region and (2) "dry" development wherein the photosensitive element is heated to a development temperature which causes the unpolymerized areas in the image region of the photopolymerizable layer to melt or soften or flow and is wicked away by contact with an absorbent material. Dry development may also be called thermal development. In most embodiments, the treatment removes all or substantially all of the uncured portions to the floor of cured polymeric material in the image portions. In addition when treatment removes the uncured portions to the floor in the image portions, the treatment removes some of the uncured photopolymer material in the unexposed portions of the element, to about or slightly less than the thickness of the cured floor. It is possible to treat an exposed photosensitive element such that the uncured material in the image portions is not completely removed to the floor of cured polymeric material, in which embodiment treating to remove the some of the uncured photopolymer material in the unexposed portions of the element would be adjusted accordingly.

Wet development is usually carried out at about room temperature. The developers can be organic solvents, aqueous or semi-aqueous solutions, and water. The choice of the developer will depend primarily on the chemical nature of the photopolymerizable material to be removed. Suitable organic solvent developers include aromatic or aliphatic hydrocarbon and aliphatic or aromatic halohydrocarbon solvents, or mixtures of such solvents with suitable alcohols. Other organic solvent developers have been disclosed in published German Application 38 28 551. Suitable semi-aqueous developers usually contain water and a water miscible organic solvent and an alkaline material. Suitable aqueous developers usually contain water and an alkaline material. Other suitable aqueous developer combinations are described in U.S. Pat. No. 3,796,602.

Development time can vary, but it is preferably in the range of about 2 to about 25 minutes. Developer can be applied in any convenient manner, including immersion, spraying and brush or roller application. Brushing aids can be used to remove the unexposed portions of the element in the image region. Washout can be carried out in an automatic processing unit which uses developer and mechanical brushing action to remove the unpolymerized portions of the plate, leaving a relief constituting the exposed image and the floor in the image region, and some portion of the photopolymerizable layer in the unexposed region that corresponds to the non-image region. In most embodiments, the processor has brushing action that is sufficient to remove the unexposed photopolymer in the image region to the floor, or can include a stop on the depth of the brushes such that the brushing action may not remove the significantly more of the uncured photopolymer layer in the unexposed region corresponding to the non-image region.

Following treatment by developing in solution, the relief printing plates are generally blotted or wiped dry, and then more fully dried in a forced air or infrared oven. Drying times and temperatures may vary however typically the plate is dried for 60 to 120 minutes at 60° C. High temperatures are not recommended because the support can shrink and this can cause registration problems.

Treating the element thermally includes heating the photosensitive element having at least one photopolymerizable layer (and the additional layer/s) to a temperature sufficient to cause the uncured portions of the photopolymerizable layer to soften or melt or flow, and contacting an outermost surface of the element to an absorbent surface to absorb or wick away the melt or flow portions. The polymerized areas of the photopolymerizable layer have a higher melting temperature than the unpolymerized areas and therefore do not melt, soften, or flow at the thermal development temperatures. Thermal development of photosensitive elements to form flexographic printing plates is described by Martens in U.S. Pat. Nos. 5,015,556; 5,175,072; 5,215,859; and by Wang et al. in WO 98113730.

The term "melt" is used to describe the behavior of the unirradiated portions of the photopolymerizable elastomeric layer subjected to an elevated temperature that softens and reduces the viscosity to permit flow and absorption by the absorbent material. The material of the meltable portion of the photopolymerizable layer is usually a viscoelastic material which does not have a sharp transition between a solid and a liquid, so the process functions to absorb the heated composition layer at any temperature above some threshold for absorption in the absorbent material. A wide temperature range may be utilized to "melt" the composition layer for the purposes of this invention. Absorption may be slower at lower temperatures and faster at higher temperatures during successful operation of the process.

The thermal treating steps of heating the photosensitive element and contacting an outermost surface of the element with an absorbent material can be done at the same time, or in sequence provided that the uncured portions of the photopolymerizable layer are still soft or in a melt state when contacted with the absorbent material. The at least one photopolymerizable layer (and the additional layer/s) are heated by conduction, convection, radiation, or other heating methods to a temperature sufficient to effect melting of the uncured portions but not so high as to effect distortion of the cured portions of the layer. The one or more additional layers disposed above the photopolymerizable layer may soften or melt or flow and be absorbed as well by the absorbent material. The photosensitive element is heated to a surface temperature above about 40° C., preferably from about 40° C. to about 230° C. (104-446° F.) in order to effect melting or flowing of the uncured portions of the photopolymerizable layer. By maintaining more or less intimate contact of the absorbent material with the photopolymerizable layer that is molten in the uncured regions, a transfer of the uncured photosensitive material from the photopolymerizable layer to the absorbent material takes place. While still in the heated condition, the absorbent material is separated from the cured photopolymerizable layer in contact with the support layer to reveal the relief structure. A cycle of the steps of heating the photopolymerizable layer and contacting the molten (portions) layer with an absorbent material can be repeated as many times as necessary to adequately remove the uncured material and create sufficient relief depth. However, it is desirable to minimize the number of cycles for suitable system performance, and typically the photopolymerizable element is thermally treated for 5 to 15 cycles. Intimate contact of the absorbent material to the photopolymerizable layer (while in the uncured portions are melt) may be maintained by the pressing the layer and the absorbent material together. Embodiments of apparatuses to thermally develop the photosensitive element are disclosed by Peterson et al. in U.S. Pat. No. 5,279,697, and also by Johnson et al. in U.S. Pat. No. 6,797,454. The photosensitive element may be placed on a drum or a planar surface in order for thermal treatment to be carried out.

The absorbent material is selected having a melt temperature exceeding the melt temperature of the uncured portions of the photopolymerizable layer and having good tear resistance at the same operating temperatures. Preferably, the selected material withstands the temperatures required to process the photosensitive element during heating. The absorbent material is selected from non-woven materials, paper stocks, fibrous woven material, open-celled foam materials, porous materials that contain more or less a substantial fraction of their included volume as void volume. The absorbent material can be in web or sheet form. The absorbent materials should also possess a high absorbency for the molten elastomeric composition. Preferred is a non-woven nylon web. It is also contemplated that the photosensitive element may undergo one or more treating steps to sufficiently remove the uncured portions to form the relief. The photosensitive element may undergo both wet development and dry development, in any order, to form the relief. A pre-development treating step may be necessary to remove one or more of the additional layers disposed above the photopolymerizable layer if such additional layers are not removable by the washout solution and/or by heating.

Figure 7:
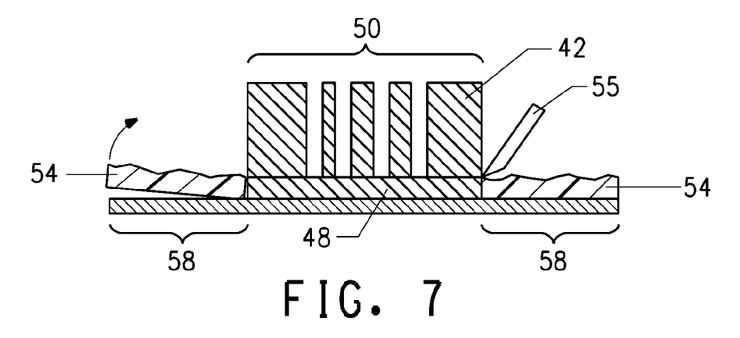
FIG. 7 is a sectional view of the element of FIG. 6 showing one embodiment of a step of removing the unexposed portion of the photopolymerizable layer from the support; by cutting the photopolymerizable layer around the relief region and separating of the unexposed portion of the photopolymerizable layer from the support and from the relief region; and forming the printing form.

As shown in FIG. 7, the present method further includes removing the unexposed region 54 of the photopolymerizable layer 14 (that correspond to the non-image region 24 of the mask 20 and that correspond to the intact region 34 of the backside mask 30) from the support 16 and from the relief portion 50, wherein the relief region 50 remains on the support 16 as the printing form. The step of removing the unexposed region 54 from the support 16 and from the relief portion 50 occurs after the treating step in which at least some of the photopolymerizable layer 14 at the unexposed region 54 has been removed to create a thinner layer of photopolymerizable material at the unexposed region 54. In most embodiments, the removing step includes cutting the treated element by first cutting through the photopolymerizable layer 14 along a perimeter of the relief region 50; and separating the unexposed region 54 of the photopolymerizable layer 14 from the support 16 and from the relief region 50. Cutting may be done manually or by a computer-driven cutting device based upon the page layout data. In most embodiments, the treated element is placed on an automatic cutting table that is connected to the computer, and a knife or blade or cutting implement 55 cuts through the photopolymerizable layer 14 along the perimeter of the relief region 50 where the relief region is adjacent the unexposed region 54, but does not cut through the underlying support 16. The photopolymerizable layer 14 is cut in depth through its thickness to be able to isolate the relief region from the surrounding or adjacent unexposed region/s 54. The separation of the unexposed region/s 54 of the photopolymerizable layer 14 from the relief region/s 50 and the unexposed region/s 54 from the support 16 can easily be accomplished manually, or even with a suitable peeling or separation device. Because backside exposure can provide improved adhesion between the photopolymerizable layer and the support, and the backside mask selectively exposes the photopolymerizable layer on the support, the adhesion of the photopolymerizable layer to the support at the relief region 50 can be different from the adhesion of the photopolymerizable layer to the support at the unexposed region 54, such that removal of the photopolymer layer at unexposed region 54 in a subsequent step is facilitated. The unexposed regions 54 of the photopolymerizable layer 14 do not adhere well to the support 16 and have a thickness suitable for easy peeling or lifting from the support, so that the relief region/s 50 remain on the support. At the removal step of the present invention, the thickness of the unexposed region 54 is less than the (raw) thickness of the photopolymerizable layer of the photosensitive element before treating, and is less than or about equal to the thickness as the floor to provide for easy handling and separation of the unexposed region from the support and relief region. In some embodiments, the support 16 can extend from one or more of the side edges of the relief region 50 to create a margin 58 for the relief region 50. A particularly suitable cutting table is a Kongsberg digital converting table, manufactured by EskoArtwork.

Figure 8:
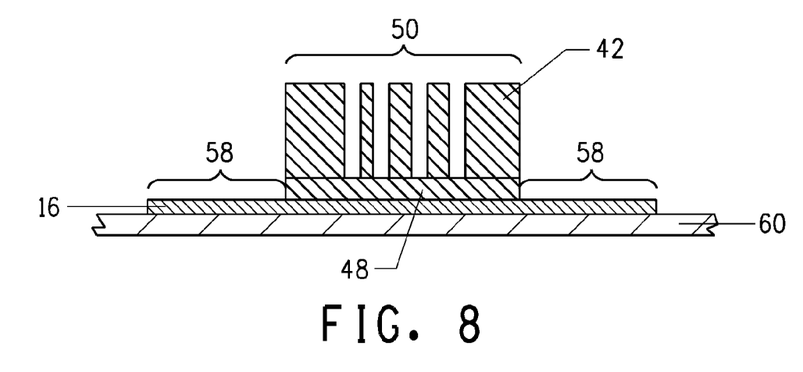
FIG. 8 is a sectional view of the printing form having a margin of the support about the relief region; the printing form mounted adjacent a carrier.

The present method can optionally include a second cutting to separate one relief region from an adjacent relief region, and thereby provide more than one individual printing form from the photosensitive element in the preparation of one or more composite forms. The second cutting is at a location between adjacent relief regions 50 such that the support 16 can extend from one or more side edge's of each of the relief region/s 50 and create the margin 58 for each of the relief regions 50. In most embodiments, the second cutting is about midway between the adjacent relief regions. In most embodiments, the second cutting provides the margin of the support surrounding the perimeter of the relief region 50. As shown in FIG. 8, the printing form, which includes the relief region 50 and the margin 58 of the support 16, is mounted onto a sheet carrier 60 for mounting onto a printing cylinder (not shown). The margin of the support provides additional contact surface for securely mounting the relief region onto a carrier used for the composite print form. In addition, the margin of the support that surrounds the relief region provides a perimeter of protection for the relief region or printing form from attack by ink solvents during printing. While ink solvents may attack the adhesive between the carrier and support at the edges of the margin surrounding the relief region, this does not sufficiently impact the retention of printing form to the carrier. The margin of support surrounding the image area of the print form is sufficiently wide to allow for easy handling and mounting of the print form to the carrier, and provides greater contact area of the print form to assure improved adhesion of the print form to the carrier.

In one embodiment, the unexposed region 54 of the photopolymerizable layer 14 corresponding to the non-image region 24 has been separated or removed from the element 10, and the second cutting cuts through the support 16 at a location between adjacent relief regions. In another embodiment, the second cutting is before the unexposed region 54 has been removed such that the second cutting cuts through the unexposed region 54 of the photopolymerizable layer 14 and through the support 16 at a location between adjacent relief regions.

In some embodiments the present method includes the following steps: providing a mask adjacent the photosensitive element; forming a backside mask from an actinic radiation opaque element; assembling the photosensitive element and the backside mask to align the intact region of the backside mask with the non-image region of the front-side mask; exposing the photosensitive element in the assembly to actinic radiation through the front-side mask and through the backside mask; treating the exposed element to form a relief region of cured portions with a floor, wherein at least some of the photopolymerizable layer remains on the support at the unexposed region; and removing the unexposed region from the support and the relief region, wherein the relief region remains on the support forming the printing form. In some other embodiments the present method includes the following steps: providing a mask adjacent the photosensitive element; forming a backside mask from an actinic radiation opaque element; assembling the photosensitive element and the backside mask to align the intact region of the backside mask with the non-image region of the front-side mask; exposing the photosensitive element in the assembly to actinic radiation through the front-side mask and through the backside mask; treating the exposed element to form a relief region of cured portions with a floor, wherein at least some of the photopolymerizable layer remains on the support at the unexposed region; and removing the unexposed region from the support and the relief region by a first cutting through the photopolymerizable layer along a perimeter of the relief region, and separating the unexposed region from the relief region and from the support, wherein the relief region remains on the support, and optionally a margin of support extends from the relief region to create the printing form. In this embodiment, the removing step that includes the first cutting and the separating occur in order after the treating step.

The photosensitive element after treatment can be uniformly post-exposed to actinic radiation to ensure that the photopolymerization process is complete and that the element will remain stable during printing and storage. This post-exposure step can utilize the same radiation source as the overall exposure. Detackification is an optional post-development treatment that can be applied if the surface of the photosensitive printing element is still tacky, such tackiness not generally being removed in post-exposure. Tackiness can be eliminated by methods well known in the art, such as treatment with bromine or chlorine solutions. Preferably, detackification is accomplished by exposure to radiation sources having a wavelength not longer than 300 nm, as disclosed in European Published Patent Application 0 017927 and Gibson U.S. Pat. No. 4,806,506.

The carrier 60 holds and maintains the position of the printing form, which includes the relief region 50 with the margin 58 of the support 16, for printing. In most embodiments, the carrier is in sheet form, but is not so limited, and can include cylindrically-shaped forms. The carrier, in sheet form, has side edges with dimensions of a length and a width that determines a size or planar area of the carrier, wherein the length and the width are substantially greater than its thickness, and has two substantially planar opposing major faces. In embodiments where the carrier is cylindrically-shaped, the size is based on a surface area of an exterior surface of the cylindrically-shaped carrier. The carrier has may include marking/s or indicator/s for positioning and registration of the image area/s prepared according to the present invention.

Materials suitable for use as the sheet carrier can be any which are flexible to wrap about the print cylinder, resistant to deformation and stretching particularly during printing, and resistant to deformation or size change upon treating. Examples of materials suitable as the carrier include, but are not limited to, vinyl plastics, linoleum, metal, and polymeric films, such as polyester. Suitable thickness of the carrier is form 0.005 to 0.185 inch (0.013 to 0.47 cm). In many embodiments, the carrier is a polymeric film of polyvinylchloride (PVC) or polyethylene terephthalate that has a thickness from 0.010 to 0.030 inch (0.025 to 0.076 cm). Materials suitable for use as the cylindrically-shaped carrier can be any supports that are for use in cylindrical printing forms, commonly referred to as print sleeves or sleeves. The type of sleeve or cylindrical support is not limited. The sleeve may be formed from single layer or multiple layers of flexible material. In some embodiments, flexible sleeves made of polymeric films are suitable. In other embodiments, sleeves of metal, such as nickel; or glass epoxy, are suitable. The sleeve can have a wall thickness from less than 10 mils (0.025 cm) to 80 mils (0.203 cm) or more. It is also contemplated that opposing ends of the carrier sheet can be joined by any appropriate means, such as for example, melt fusing, taping, stitching, clamping, stapling, taping, gluing, and sewing, to form a cylindrically-shaped carrier. The carrier can be formed into a cylindrical shape prior to, but preferably after, the image area is secured to the carrier sheet.

The carrier (in sheet form) has a leading end or leading edge where at least two openings or holes can be located. The at least two holes are spaced apart in a row located near and parallel to the leading end. The size, the shape, and number of the holes (beyond the at least two holes) are not particularly limited for the purposes of the present invention. The at least two holes in the leading ends of the carrier provide the capability to register the carrier to the printing cylinder (and in the laser exposure apparatus). The at least two holes in the leading ends of the carrier can also be used to secure the carrier to a mounting bar for mounting. The holes in the leading end of the carrier can be machined, punched, or drilled by conventional equipment. Sources of conventional punching equipment are manufacturers of film punches for the printing industry such as Stoesser, Burgess Industries, and Carlson. After punching holes in each of the leading ends of the carrier, the single photosensitive element is positioned adjacent the carrier. In most embodiments, the photosensitive element is positioned on top of the carrier.

In embodiments where the carrier is cylindrically-shaped, the carrier may be (pre) mounted onto a support cylinder associated with an imaging or other apparatus and the one photosensitive element is positioned adjacent the cylindrical carrier. The image area can be held in position on the carrier while mounting by taping or pinning one or more ends of the image area to the carrier.

The prepared printing form can be secured or mounted using any of the many means known to those skilled in the art. Most embodiments involve applying double-sided adhesive tape or some other suitable adhesive or glue to the image area, to the carrier, or to both. Other methods of securing the image area to the carrier are encompassed within the present invention and include, but are not limited to, pinning, stitching, and stapling. In some embodiments, the double-sided adhesive tape is applied to the support of the image area. In other embodiments, the support is removed from the precursor and the double-sided adhesive tape is applied to a surface of the precursor where the support was previously.

Photosensitive Element

The photosensitive element or precursor includes at least one layer of a photopolymerizable composition. The term "photosensitive" encompass any system in which the at least one photosensitive layer is capable of initiating a reaction or reactions, particularly photochemical reactions, upon response to actinic radiation. In some embodiments, the photosensitive element includes a support for the photopolymerizable layer. In some embodiments, the photopolymerizable layer is an elastomeric layer that includes a binder, at least one monomer, and a photoinitiator. In some embodiments, the photosensitive element includes a layer of an infrared sensitive material which can also function as an actinic radiation opaque material adjacent the photopolymerizable layer, opposite the support.

Unless otherwise indicated, the term "photosensitive element" encompasses printing precursors capable of undergoing exposure to actinic radiation and treating to form a surface suitable for printing. Unless otherwise indicated, the "photosensitive element" and "printing form" includes elements or structures in any form which become suitable for printing or are suitable for printing, including, but not limited to, flat sheets, plates, plates-on-sleeves, and plates-on-carriers. It is contemplated that printing form resulting from the photosensitive element has end-use printing applications for relief printing, such as flexographic and letterpress printing. Relief printing is a method of printing in which the printing form prints from an image area, where the image area of the printing form is raised and the non-image area is depressed.

The photosensitive element includes at least one layer of a photopolymerizable composition. As used herein, the term "photopolymerizable" is intended to encompass systems that are photopolymerizable, photocrosslinkable, or both. The photopolymerizable layer is a solid elastomeric layer formed of the composition comprising a binder, at least one monomer, and a photoinitiator. The photoinitiator has sensitivity to actinic radiation. Throughout this specification actinic light will include ultraviolet radiation and/or visible light. The solid layer of the photopolymerizable composition is treated with one or more solutions and/or heat to form a relief suitable for flexographic printing. As used herein, the term "solid" refers to the physical state of the layer which has a definite volume and shape and resists forces that tend to alter its volume or shape. The layer of the photopolymerizable composition is solid at room temperature, which is a temperature between about 5° C. and about 30° C. In most embodiments, a solid layer of the photopolymerizable composition of the photosensitive element is unpolymerized, but can include some embodiments where the photopolymerizable composition may be polymerized (i.e., photohardened, or cured), or both polymerized (i.e., floor) and unpolymerized.

The binder is not limited and can be a single polymer or mixture of polymers. In some embodiments, the binder is an elastomeric binder. In other embodiments, the binder becomes elastomeric upon exposure to actinic radiation. Binders include natural or synthetic polymers of conjugated diolefin hydrocarbons, including polyisoprene, 1,2-polybutadiene, 1,4-polybutadiene, butadiene/acrylonitrile, and diene/styrene thermoplastic-elastomeric block copolymers. In some embodiments, the binder is an elastomeric block copolymer of an A-B-A type block copolymer, where A represents a non-elastomeric block, and B represents an elastomeric block. The non-elastomeric block A can be a vinyl polymer, such as for example, polystyrene. Examples of the elastomeric block B include polybutadiene and polyisoprene. The binder can be soluble, swellable, or dispersible in aqueous, semi-aqueous, water, or organic solvent washout solutions. Generally, the elastomeric binders which are suitable for washout development are also suitable for use in thermal treating wherein the unpolymerized areas of the photopolymerizable layer soften, melt, or flow upon heating.

Either a single elastomeric material or a combination of materials can be used for the elastomeric layer so long as the characteristics desired for relief printing are obtained. Examples of elastomeric materials are described in *Plastic Technology Handbook*, Chandler et al., Ed., (1987). In many cases it may be desirable to use thermoplastic elastomeric materials to formulate the elastomeric layer. When a thermoplastic elastomeric layer is reinforced photochemically, the layer remains elastomeric but is no longer thermoplastic after such reinforcement. This includes, but is not limited to, elastomeric materials such as copolymers of butadiene and styrene, copolymers of isoprene and styrene, styrene-diene-styrene triblock copolymers.

The photopolymerizable composition contains at least one compound capable of addition polymerization that is compatible with the binder to the extent that a clear, non-cloudy photosensitive layer is produced. The at least one compound capable of addition polymerization may also be referred to as a monomer. Monomers that can be used in the photopolymerizable composition are well known in the art and include, but are not limited to, addition-polymerization ethylenically unsaturated compounds with at least one terminal ethylenic group. The composition can contain a single monomer or a combination of monomers. Monomers can be appropriately selected by one skilled in the art to provide suitable elastomeric and other properties to the photopolymerizable composition.

The photoinitiator can be any single compound or combination of compounds which is sensitive to actinic radiation, generating free radicals which initiate the polymerization of the monomer or monomers without excessive termination. Any of the known classes of photoinitiators, particularly free radical photoinitiators may be used. Alternatively, the photoinitiator may be a mixture of compounds in which one of the compounds provides the free radicals when caused to do so by a sensitizer activated by radiation. Preferably, the photoinitiator for the main exposure (as well as post-exposure and backflash) is sensitive to visible or ultraviolet radiation, between 310 to 400 nm, and preferably 345 to 365 nm.

The photopolymerizable composition can contain other additives depending on the final properties desired. Additional additives to the photopolymerizable composition include sensitizers, plasticizers, rheology modifiers, thermal polymerization inhibitors, colorants, processing aids, antioxidants, antiozonants, dyes, and fillers.

The thickness of the photopolymerizable layer can vary over a wide range depending upon the printing end-use application. In some embodiments, the photosensitive layer can have a thickness from about 0.005 inch to about 0.250 inch or greater (0.013 to 0.64 cm or greater). Typical thickness of the photopolymerizable layer is from about 0.045 inches to about 0.250 inches (about 0.025 cm to about 0.64 cm). In some embodiments such as for corrugated printing, the photosensitive layer can have a thickness from about 0.100 inch to about 0.300 inch (0.25 to 0.76 cm).

The photosensitive element typically includes a support adjacent the layer of the photopolymerizable composition. The support can be composed of any material or combination of materials that is conventionally used with photosensitive elements used to prepare printing forms. In some embodiments, the support is transparent to actinic radiation to accommodate exposure through the support. Examples of suitable support materials include polymeric films such those formed by addition polymers and linear condensation polymers, transparent foams and fabrics, such as fiberglass. Under certain end-use conditions, metals such as aluminum, steel, and nickel, may also be used as a support, even though a metal support is not transparent to radiation. In some embodiments, the support is a polyester film. In one embodiment, the support is polyethylene terephthalate film. In some embodiments, the support has a thickness from 0.002 to 0.050 inch (0.0051 to 0.127 cm). In other embodiments, the thickness for the sheet form support is 0.003 to 0.016 inch (0.0076 to 0.040 cm).

Optionally, the element includes an adhesive layer between the support and the photopolymerizable layer, or a surface of the support that is adjacent the photopolymerizable layer has an adhesion promoting surface. Further, the adhesion of the photopolymerizable layer to the support can be adjusted by exposing the element to actinic radiation through the support as disclosed by Feinberg et al. in U.S. Pat. No. 5,292,617.

As is well known to those of ordinary skill in the art, the photosensitive element may include one or more additional layers adjacent the photopolymerizable layer, that is, on a side of the photopolymerizable layer opposite the support. Depending on desired use, the additional layers may be opaque or transparent to actinic radiation, and may have one or more functions for the photosensitive element. The additional layers include, but are not limited to, a release layer, an elastomeric capping layer, a barrier layer, an adhesion modifying layer, a layer which alters the surface characteristics of the photosensitive element, and combinations thereof. The one or more additional layers can be removable, in whole or in part, during treatment. One or more of the additional layers may cover or only partially cover the photosensitive composition layer. It is well within the ordinary skill of those in the art to select and prepare additional layers on the photopolymerizable layer according to desired end-use.

In one embodiment, the photosensitive element includes the infrared sensitive layer which is also an actinic radiation opaque layer disposed above a surface of the photopolymerizable layer opposite the support. The actinic radiation opaque layer may substantially cover the surface or only cover an imageable portion of the photopolymerizable layer. The actinic radiation opaque layer is substantially opaque to actinic radiation that corresponds with the sensitivity of the photopolymerizable material. The actinic radiation opaque layer can be used with or without a barrier layer. If used with the barrier layer, the barrier layer is disposed between the photopolymerizable layer and the radiation opaque layer. If present, the barrier layer can minimize migration of materials between the photopolymerizable layer and the radiation opaque layer. The actinic radiation opaque layer is also sensitive to laser radiation that can selectively remove or transfer the opaque layer. In one embodiment, the actinic radiation opaque layer is sensitive to infrared laser radiation. The actinic radiation opaque layer comprises a radiation-opaque material, an infrared-absorbing material, and an optional binder. Dark inorganic pigments, such as carbon black and graphite, mixtures of pigments, metals, and metal alloys generally function as both infrared-sensitive material and radiation-opaque material. The optional binder is a polymeric material which is not limited. The thickness of the actinic radiation opaque layer should be in a range to optimize both sensitivity and opacity, which is generally from about 20 Angstroms to about 50 micrometers. The actinic radiation opaque layer should have a transmission optical density of greater than 2.0 in order to effectively block actinic radiation and the polymerization of the underlying photopolymerizable layer.

The photosensitive printing element of the present invention may further include a temporary coversheet on top of the uppermost layer of the element. One purpose of the coversheet is to protect the uppermost layer of the photosensitive printing element during storage and handling. Examples of suitable materials for the coversheet include thin films of polystyrene, polyethylene, polypropylene, polycarbonate, fluoropolymers, polyamide or polyesters, which can be subbed with release layers. The coversheet is preferably prepared from polyester, such as Mylar® polyethylene terephthalate film; most preferably the coversheet is 5-mil Mylar®.

The photosensitive element on the composite printing form, after exposure (and treating) of the photosensitive element, has a durometer of about 20 to about 80 Shore A. In some embodiments, the (exposed and treated) photosensitive element on the composite printing form has a durometer of 30 to 50 Shore A. The Shore durometer is a measure of the resistance of a material toward indentation. Durometer of Shore A is the scale typically used for soft rubbers or elastomeric materials, where the higher the value the greater the resistance toward penetration. The durometer of the printing form can be measured according to standardized procedures described in DIN 53,505 or ASTM D2240-00.

What is claimed is:

1. A method for preparing a printing form from a photosensitive element comprising a photopolymerizable layer on a support comprising:
   a) providing a front mask adjacent the photosensitive element disposed above a side of the photopolymerizable layer opposite the support, wherein the mask comprises an image region and a non-image region;
   b) forming from an actinic radiation opaque element a backside mask having an intact region and a cutout region;
   c) placing the backside mask adjacent to the support of the element of step a), and aligning the intact region with the non-image region;
   d) exposing the element of step c) to actinic radiation through the front mask forming cured portions of the photopolymerizable layer corresponding to the image region;
   e) exposing the element of step c) to actinic radiation through the backside mask forming a cured floor adjacent the cured portions, and providing an unexposed region of the photopolymerizable layer corresponding to the non-image region;
   f) treating the element resulting after exposing steps d) and e) to form a relief region of the cured portions with the floor, wherein at least some of the photopolymerizable layer remains on the support at the unexposed region; and
   g) removing the unexposed region of the photopolymerizable layer from the support and from the relief region, wherein the relief region remains on the support forming the printing form, and the removing comprises
      g1) cutting the element of step f) comprising a first cutting through the photopolymerizable layer along a perimeter of the relief region; and
      g2) separating the unexposed region of the photopolymerizable layer from the relief region and from the support.

2. The method of claim 1 wherein the step d) and the step e) are done simultaneously, or sequentially in any order.

3. The method of claim 1 wherein after step f), the floor has a thickness and the photopolymerizable layer remaining on the support in the unexposed region has a thickness that is the same as the floor thickness.

4. The method of claim 1 wherein after step f), the floor has a thickness and the photopolymerizable layer remaining on the support in the unexposed region has a thickness that is less than the thickness of the floor.

5. The method of claim 4 wherein the thickness of the photopolymerizable layer remaining on the support in the unexposed region is about 1 to about 20 mils less than the thickness of the floor.

6. The method of claim 1 wherein after step f), the photopolymerizable layer remaining on the support in the unexposed region has a thickness from 30 to 51 mils.

7. The method of claim 1 wherein after step f), the photopolymerizable layer remaining on the support in the unexposed region has a thickness from 50 to 123 mils.

8. The method of claim 1 wherein the photopolymerizable layer of the element prior to step f) has a thickness of about 90 to 280 mils.

9. The method of claim 1 wherein step g) further comprises a second cutting in the unexposed region through the photopolymerizable layer and the support forming a margin of the support extending from at least one side edge of the relief region.

10. The method of claim 1 wherein after step g) a margin of the support extends beyond at least one side edge of the perimeter of the relief region.

11. The method of claim 1 wherein the providing a mask step a) comprises forming an integral mask on the photosensitive element of an actinic radiation opaque layer disposed above a side of the photopolymerizable layer opposite the support.

12. The method of claim 1 further comprising:
   creating at least one registration mark in the non-image region; and
   creating at least one registration mark in the intact region of the backside mask,
   wherein the aligning of the intact region with the non-image region is performed by aligning the at least one registration mark of the non-image region with the at least one registration mark of the intact region.

* * * * *